United States Patent
Yang

(10) Patent No.: US 9,735,213 B2
(45) Date of Patent: Aug. 15, 2017

(54) ORGANIC LIGHT-EMITTING DISPLAY APPARATUS AND MANUFACTURING METHOD THEREOF

(71) Applicant: SAMSUNG DISPLAY CO., LTD., Yongin, Gyeonggi-Do (KR)

(72) Inventor: Yongho Yang, Yongin (KR)

(73) Assignee: SAMSUNG DISPLAY CO., LTD., Yongin, Gyeonggi-Do (KR)

(*) Notice: Subject to any disclaimer, the term of this patent is extended or adjusted under 35 U.S.C. 154(b) by 0 days.

(21) Appl. No.: 14/798,707

(22) Filed: Jul. 14, 2015

(65) Prior Publication Data
US 2016/0181334 A1 Jun. 23, 2016

(30) Foreign Application Priority Data
Dec. 19, 2014 (KR) .................. 10-2014-0184958

(51) Int. Cl.
*H01L 27/32* (2006.01)
*H01L 29/45* (2006.01)
*H01L 51/52* (2006.01)

(52) U.S. Cl.
CPC .......... *H01L 27/3246* (2013.01); *H01L 29/45* (2013.01); *H01L 51/5281* (2013.01)

(58) Field of Classification Search
CPC .. H01L 27/3246; H01L 51/5281; H01L 29/45
See application file for complete search history.

(56) References Cited

U.S. PATENT DOCUMENTS

| 8,487,301 | B2* | 7/2013 | Choi | H01L 27/3246 257/40 |
| 2005/0133793 | A1* | 6/2005 | Kim | H01L 29/41733 257/72 |
| 2010/0193790 | A1* | 8/2010 | Yeo | H01L 27/3248 257/59 |

FOREIGN PATENT DOCUMENTS

| KR | 10-2005-0052289 A | 6/2005 |
| KR | 10-2006-0055052 A | 6/2005 |
| KR | 10-2011-0077838 A | 7/2011 |
| KR | 10-2013-0037601 A | 4/2013 |
| KR | 10-2013-0057594 A | 6/2013 |

* cited by examiner

*Primary Examiner* — Kyoung Lee
(74) *Attorney, Agent, or Firm* — Lee & Morse P.C.

(57) ABSTRACT

An organic light-emitting display apparatus includes a substrate, a thin film transistor on the substrate, a pixel electrode electrically connected to the thin film transistor, a pixel defining layer having an opening exposing a center portion of the pixel electrode and covering an edge of the pixel electrode, and a first low reflection layer between the pixel electrode and the pixel defining layer, the first low reflection layer including a metal.

18 Claims, 5 Drawing Sheets

ORGANIC LIGHT-EMITTING DISPLAY APPARATUS AND MANUFACTURING METHOD THEREOF

CROSS-REFERENCE TO RELATED APPLICATION

Korean Patent Application No. 10-2014-0184958, filed on Dec. 19, 2014, in the Korean Intellectual Property Office, and entitled: "Organic Light-Emitting Display Apparatus and Manufacturing Method Thereof," is incorporated by reference herein in its entirety.

BACKGROUND

1. Field

Provided are an organic light-emitting display apparatus and a manufacturing method thereof.

2. Description of the Related Art

Organic light-emitting display apparatuses may provide a wide viewing angle, a superior contrast, and a fast response speed.

In an organic light-emitting display apparatus, thin film transistors and organic light-emitting devices may be formed on a substrate and the organic light-emitting devices may be operated to emit light by themselves. The organic light-emitting display apparatus may be used as a display portion of a compact product, e.g., a mobile phone or a display portion of a large product, e.g., a television set.

In an organic light-emitting device of the organic light-emitting display apparatus, an intermediate layer including a light-emitting layer may be interposed between the pixel electrode and the opposing electrode. A light-emission portion of the organic light-emitting device may be defined by a pixel defining layer.

In an organic light-emitting display apparatus, reflection visibility may be reduced by the external light reflection characteristics of a panel by the light reflected around the light-emitting portion.

SUMMARY

Embodiments may be realized by providing an organic light-emitting display apparatus, including a substrate; a thin film transistor on the substrate; a pixel electrode electrically connected to the thin film transistor; a pixel defining layer having an opening exposing a center portion of the pixel electrode and covering an edge of the pixel electrode; and a first low reflection layer between the pixel electrode and the pixel defining layer, the first low reflection layer including a metal.

Reflectivity of the first low reflection layer may be equal to or less than 60%.

The first low reflection layer may be on the edge of the pixel electrode covered by the pixel defining layer.

The first low reflection layer may be on the pixel electrode except an opening of the pixel defining layer.

The first low reflection layer may include a first etching surface covered by the pixel defining layer and a second etching surface exposed by the pixel defining layer.

The first etching surface may have a same etching surface as the pixel electrode.

The second etching surface may have a same etching surface as the pixel defining layer that exposes the center portion of the pixel electrode.

The thin film transistor may include a semiconductor layer, a gate electrode, a source electrode, and a drain electrode, and the apparatus may further include a second low reflection layer that is on the source electrode and the drain electrode and includes a metal.

The apparatus may further include an insulating film that is between the pixel electrode and the source electrode and the drain electrode. The second low reflection layer may be between the insulating film and the source electrode and the drain electrode.

The second low reflection layer may directly contact the source electrode and the drain electrode.

The second low reflection layer, the source electrode, and the drain electrode may have a same etching surface.

The first low reflection layer may include one of TiN, $Cr/CrO_x$, $TaO_x$, $MoO_x$, black resin, or a polarization material.

Embodiments may be realized by providing a method of manufacturing an organic light-emitting display apparatus, the method including forming a thin film transistor on a substrate; forming a pixel electrode and a first low reflection layer by coating a conductive layer on the substrate to be electrically connected to the thin film transistor, coating a first low reflection layer including a metal material on the conductive layer, and simultaneously pattering the conductive layer and the first low reflection layer; forming a pixel defining layer having an opening that exposes a center portion of the first low reflection layer and covers an edge of the first low reflection layer; and etching the center portion of the first low reflection layer that is exposed by the opening of the pixel defining layer.

Reflectivity of the first low reflection layer may be equal to or less than 60%.

In etching the center portion of the first low reflection layer, the pixel electrode may be exposed through the opening of the pixel defining layer as the first low reflection layer is etched.

The first low reflection layer may be formed to have a first etching surface covered by the pixel defining layer and a second etching surface exposed by the pixel defining layer, and forming the first low reflection layer may be performed simultaneously with forming the pixel electrode and forming the second etching surface may be performed simultaneously with etching the center portion of the first low reflection layer.

Forming the thin film transistor may include forming a semiconductor layer; forming a gate electrode; and forming a source electrode and a drain electrode on which a second low reflection layer is formed.

Forming the source electrode and the drain electrode may include forming a conductive layer to be electrically connected to the semiconductor layer; forming the second low reflection layer including a metal material on the conductive layer; and simultaneously pattering the conductive layer and the second low reflection layer.

The source electrode, the drain electrode, and the second low reflection layer may have a same etching surface.

The first low reflection layer and the second low reflection layer each may include one of TiN, $Cr/CrO_x$, $TaO_x$, $MoO_x$, black resin, or a polarization material.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
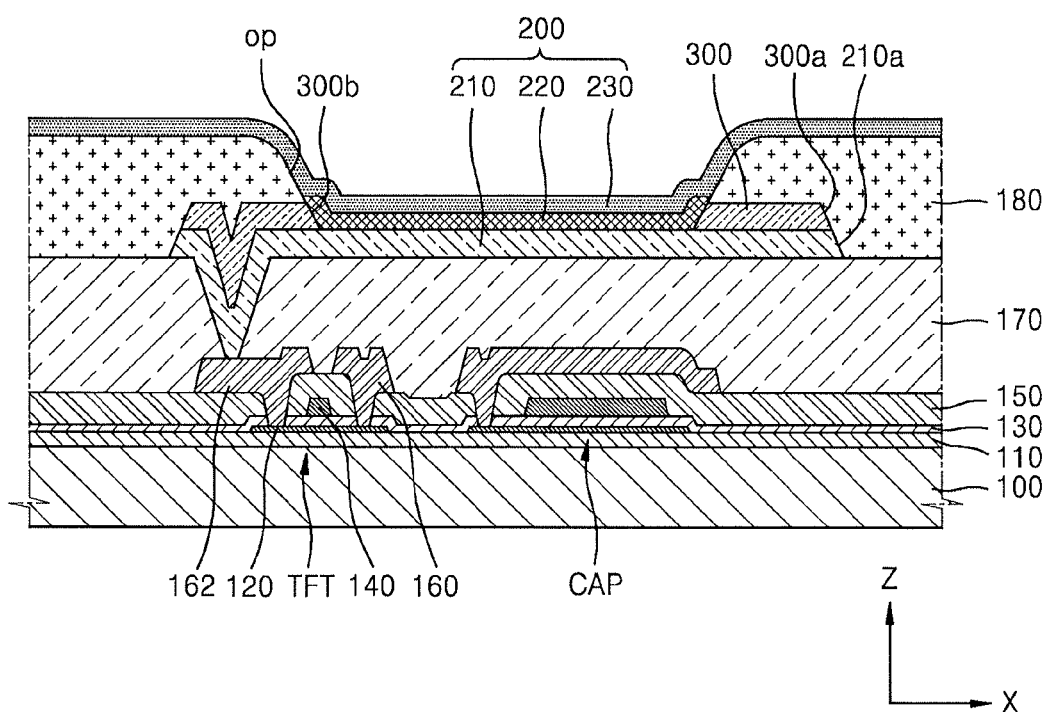
FIG. 1 illustrates a schematic cross-sectional view of an organic light-emitting display apparatus according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

It will be understood that although the terms "first," "second," etc., may be used herein to describe various components, these components should not be limited by these terms. These components are only used to distinguish one component from another. As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on" another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of components in the drawings may be exaggerated for convenience of explanation. In other words, since sizes and thicknesses of components in the drawings are arbitrarily illustrated for convenience of explanation, the following embodiments are not limited thereto. Like reference numerals refer to like elements throughout.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

FIG. 1 illustrates a schematic cross-sectional view of an organic light-emitting display apparatus according to an exemplary embodiment.

Referring to FIG. 1, the organic light-emitting display apparatus according to the present exemplary embodiment may include a substrate 100, a thin film transistor (TFT) arranged on the substrate 100, a pixel electrode 210 electrically connected to the TFT, a pixel defining layer 180 defining a pixel region, and a low reflection layer 300 including a metal material, e.g., including a metal.

The substrate 100 may be formed of a variety of materials, for example, a glass material, a metal material, or a plastic material including polyethylen terephthalate (PET), polyethylen naphthalate (PEN), or polyimide. The substrate 100 may have a display region in which a plurality of pixels may be arranged and a peripheral region encompassing the display region.

The TFT and a capacitor CAP may be arranged on the substrate 100. Although FIG. 1 illustrates one TFT and one capacitor, in some exemplary embodiments, a plurality of TFTs and capacitors may be provided. An organic light-emitting device that is electrically connected to the TFT may be disposed on the TFT. The TFT may include a semiconductor layer 120 including amorphous silicon, polycrystalline silicon, or an organic semiconductor material, a gate electrode 140, a source electrode 160, and a drain electrode 162. A structure of the TFT is described below in detail.

To planarize a surface of the substrate 100 or prevent intrusion of impurities into the semiconductor layer 120 of the TFT, a buffer layer 110 formed of silicon oxide or silicon nitride may be arranged on the substrate 100. Then, the semiconductor layer 120 may be arranged on the buffer layer 110.

The gate electrode 140 may be arranged on the semiconductor layer 120. The source electrode 160 and the drain electrode 162 may be electrically connected according to a signal applied to the gate electrode 140. The gate electrode 140 may be formed of at least one material of, for example aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or a multilayer, taking into consideration, for example, close adhesion with a neighboring layer, and surface planarization and processability of a stacked layer.

To secure insulation between the semiconductor layer 120 and the gate electrode 140, a gate insulating film 130 that is formed of silicon oxide and/or silicon nitride may be interposed between the semiconductor layer 120 and the gate electrode 140.

An interlayer insulating film 150 may be arranged on the gate electrode 140. The interlayer insulating film 150 may be formed of a material such as silicon oxide or silicon nitride in a single layer or a multilayer.

The source electrode 160 and the drain electrode 162 may be arranged on the interlayer insulating film 150. The source electrode 160 and the drain electrode 162 each may be electrically connected to the semiconductor layer 120 via contact holes respectively formed in the interlayer insulating film 150 and the gate insulating film 130. In consideration of conductivity, the source electrode 160 and the drain electrode 162 may be formed of at least one material of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or a multilayer.

A protection film covering the TFT may be arranged to protect the TFT having the above structure. The protection film may be formed of, for example, an inorganic substance such as silicon oxide, silicon nitride, or silicon oxynitride.

An insulating film 170 may be arranged on the substrate 100. The insulating film 170 may be a planarization film or a protection film. When the organic light-emitting device is arranged on the TFT, the insulating film 170 may also planarize an upper surface of the TFT and protect the TFT and other various components.

The insulating film 170 may be formed of, for example, an acryl-based organic substance or benzocyclobutene (BCB). As illustrated in FIG. 1, the buffer layer 110, the gate insulating film 130, the interlayer insulating film 150, and the insulating film 170 may be formed on an entire surface of the substrate 100.

The pixel defining layer 180 may be arranged on the TFT. The pixel defining layer 180 may be arranged on the insulating film 170 and may have an opening OP that exposes a center portion of the pixel electrode 210 and covering an edge of the pixel defining layer 180, which is described later. The pixel defining layer 180 may define to be a light-emitting region on the substrate 100.

The pixel defining layer 180 may be, for example, an organic insulating film. The organic insulating film may include an acryl-based polymer such as poly(methyl methacrylate) (PMMA), polystyrene (PS), a polymer derivative having a phenol group, an imide-based polymer, an aryl ether-based polymer, an amide-based polymer, a fluorine-based polymer, a p-xylene based polymer, a vinyl alcohol-based polymer, and a combination thereof.

The pixel electrode 210 may be arranged on the insulating film 170. The organic light-emitting device may include the pixel electrode 210, the intermediate layer 220 including an emission layer EML, which is described later, and an opposing electrode 230. The pixel electrode 210 may be electrically connected to the TFT and the organic light-emitting device may emit light according to an electric signal output from the TFT. The pixel electrode 210 may be electrically connected to any one of the source electrode 160 and the drain electrode 162 of the TFT through a via hole formed in the insulating film 170.

The center portion of the pixel electrode 210 may be exposed by the opening OP of the pixel defining layer 180. The center portion of the pixel electrode 210 that is exposed by the pixel defining layer 180 may be interested to be the light-emitting region. An edge portion of the pixel electrode 210 may be formed in a structure of being covered by the pixel defining layer 180.

The pixel electrode 210 may be formed as a (semi-)transparent electrode or a reflective electrode. When the pixel electrode 210 is formed as a (semi-) transparent electrode, the pixel electrode 210 may be formed of, for example, ITO, IZO, ZnO, In$_2$O$_3$, IGO, or AZO. When the pixel electrode 210 is formed in a reflective electrode, the pixel electrode 210 may have a reflective film formed of, for example, Ag, Mg, Al, Pt, Pd, Au, Ni, Nd, Ir, Cr, or a combination thereof, and a layer formed of ITO, IZO, ZnO, In$_2$O$_3$, IGO, or AZO. In an embodiment, the pixel electrode 210 may be formed of various materials. The structure of the pixel electrode 210 may be variously formed, for example, in a single layer or a multilayer.

The low reflection layer 300 may be interposed between the pixel electrode 210 and the pixel defining layer 180. The low reflection layer 300 may be on an edge portion of the pixel electrode 210 that is covered by the pixel defining layer 180. The low reflection layer 300 may overlap the edge portion of the pixel electrode 210 and may have a shape that exposes the center portion of the pixel electrode 210, i.e., the low reflection layer 300 may not be in the center portion of the pixel electrode 210.

The low reflection layer 300 may have a first etching surface 300a and a second etching surface 300b. The first etching surface 300a may be arranged at the outer side of the second etching surface 300b and may signify a portion covered by the pixel defining layer 180. The second etching surface 300b may be arranged adjacent to the light-emitting region of the pixel electrode 210 and may signify a portion exposed by the pixel defining layer 180.

The first etching surface 300a may have the same etching surface as that of the pixel electrode 210. The pixel electrode 210 and the low reflection layer 300 may be simultaneously patterned in a manufacturing process, which is described below in detail in the description of a manufacturing method. The second etching surface 300b may have the same etching surface as the etching surface that forms the opening OP of the pixel defining layer 180 exposing the center portion of the pixel electrode 210. The center portion of the low reflection layer 300 corresponding to the center portion of the pixel electrode 210 may be etched using a pattern of the opening OP of the pixel defining layer 180 in the manufacturing process, which is described below in detail in the description of a manufacturing method.

The low reflection layer 300 may include a metal material. Metal having a low reflectivity may be used as the metal material, and the reflectivity of the low reflection layer 300 may be equal to or less than 60%. For example, the low reflection layer 300 may be formed of TiN, Cr/CrO$_x$, TaO$_x$, MoO$_x$, black resin, or a polarization material. The polarization material may include a circular polarized film attached on an upper portion of a panel to reduce the reflectivity visible to a viewer of a metal film in the organic light-emitting display apparatus. The polarization material in conjunction with the reflection of the metal film may result in offset interference, reducing visibility of reflected light.

For the organic light-emitting display apparatus, light may be reflected from a pattern of the pixel electrode 210 other than the light-emitting region of the organic light-emitting device. To prevent reduction of reflection visibility according to the external light reflection characteristics of a panel, for example, due to the light, the low reflection layer 300 may be arranged between the pixel electrode 210 and the pixel defining layer 180. The low reflection layer 300 may be formed to include a metal material having a low reflectivity as described above, light reflected from a region other than the light-emitting region may be reduced, and the reduction of reflection visibility according to the external light reflection characteristics of a panel may be remarkably reduced, i.e., a viewer may not detect reflection when viewing the display.

The intermediate layer 220 may be arranged in the light-emitting region that is defined by the pixel defining layer 180. For example, the intermediate layer 220 may include an emission layer (EML) emitting light according to an electric signal and may further include a hole injection layer (HIL) arranged between the EML and the pixel electrode 210, a hole transport layer (HTL), and an electron transport layer (ETL) arranged between the EML and the opposing electrode 230, and an electron injection layer (EIL), which are stacked in a single or combined structure. In an embodiment, the intermediate layer 220 may have various structures.

The opposing electrode 230 facing the pixel electrode 210 while covering the intermediate layer 220 including the EML may be arranged on the entire surface of the substrate 100. The opposing electrode 230 may be formed as a (semi-) transparent electrode or a reflective electrode.

When the opposing electrode 230 is formed as a (semi-) transparent electrode, the opposing electrode 230 may have a layer formed of a metal having a low work function, that is, Li, Ca, LiF/Ca, LiF/Al, Al, Ag, Mg, and a compound thereof, and a (semi-) transparent conductive layer such as ITO, IZO, ZnO, or $In_2O_3$. When the opposing electrode 230 is formed as a reflective electrode, the opposing electrode 230 may have a layer formed of Li, Ca, LiF/Ca, LiF/Al, Al, Ag, Mg, and a compound thereof. In an embodiment, the structure and material of the opposing electrode 230 may be variously modified.

Figure 2:
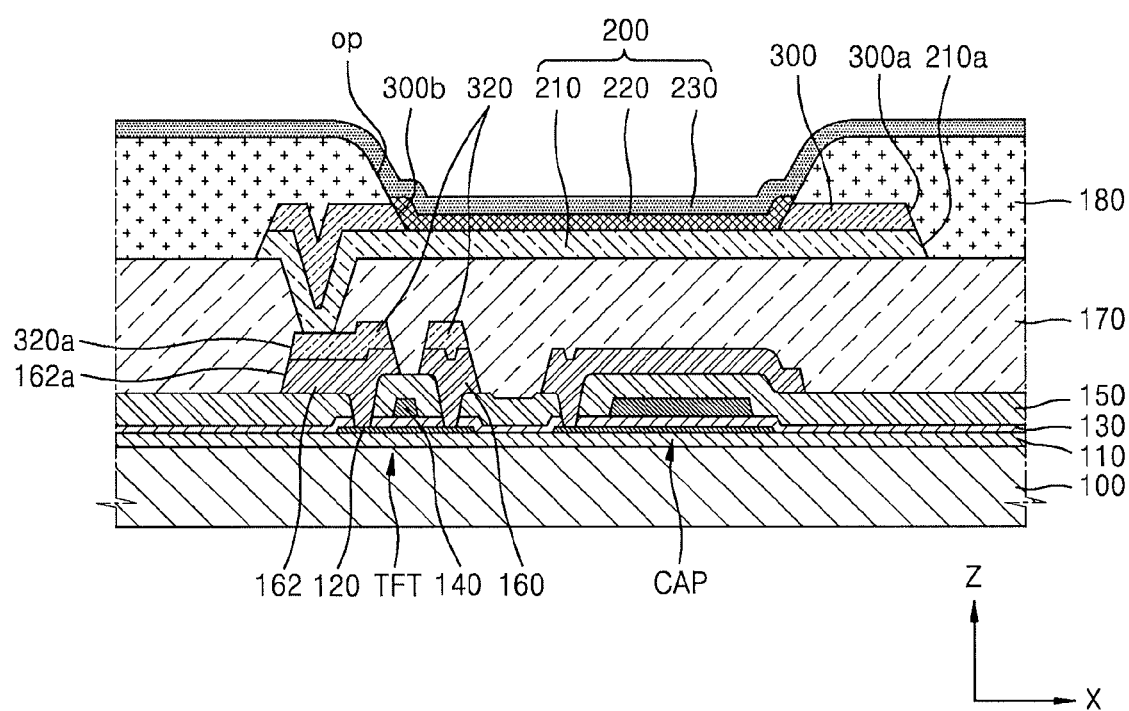
FIG. 2 illustrates a schematic cross-sectional view of an organic light-emitting display apparatus according to an another exemplary embodiment.

FIG. 2 illustrates a schematic cross-sectional view of an organic light-emitting display apparatus according to an another exemplary embodiment.

Referring to FIG. 2, an organic light-emitting display apparatus according to an exemplary embodiment may include the substrate 100, the TFT arranged on the substrate 100, the pixel electrode 210 electrically connected to the TFT, the pixel defining layer 180 defining a pixel region, the low reflection layer 300 including a metal material as a first low reflection layer, and a second low reflection layer 320.

The substrate 100 may be formed of various materials such as a glass material, a metal material, or a plastic material, for example, polyethylen terephthalate (PET), polyethylen naphthalate (PEN), or polyimide. The substrate 100 may have a display region where a plurality of pixels may be arranged, and a peripheral region surrounding the display region.

The TFT and the capacitor CAP may be arranged on the substrate 100. Although FIG. 1 illustrates one TFT and one capacitor CAP, in some cases, a plurality of TFTs and CAPs may be provided. The organic light-emitting device that may be electrically connected to the TFT may be arranged on the TFT. The TFT may include the semiconductor layer 120 including amorphous silicon, polycrystalline silicon, or an organic semiconductor material, the gate electrode 140, the source electrode 160 and the drain electrode 162. A structure of the TFT is described below in detail.

First, to planarize the surface of the substrate 100 or prevent intrusion of impurities into the semiconductor layer 120 of the TFT, the buffer layer 110 formed of silicon oxide or silicon nitride may be arranged on the substrate 100. Then, the semiconductor layer 120 may be arranged on the buffer layer 110.

While the gate electrode 140 may be arranged on the semiconductor layer 120, the source electrode 160 and the drain electrode 162 may be electrically connected according to a signal applied to the gate electrode 140. Taking into consideration, for example, close adhesion with a neighboring layer, and surface planarization and processability of a stacked layer, the gate electrode 140 may be formed of at least one material of, for example, one or more materials of, for example aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or a multilayer.

To secure insulation between the semiconductor layer 120 and the gate electrode 140, the gate insulating film 130 formed of silicon oxide and/or silicon nitride may be interposed between the semiconductor layer 120 and the gate electrode 140.

While the interlayer insulating film 150 may be arranged on the gate electrode 140, the interlayer insulating film 150 may be formed of a material such as silicon oxide or silicon nitride in a single layer or a multilayer.

The source electrode 160 and the drain electrode 162 may be arranged on the interlayer insulating film 150. The source electrode 160 and the drain electrode 162 electrically may contact the semiconductor layer 120 via a contact hole formed in the interlayer insulating film 150 and the gate insulating film 130. In consideration of conductivity, the source electrode 160 and the drain electrode 162 may be formed of at least one material of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or a multilayer.

A protection film covering the TFT may be arranged to protect the TFT having the above structure. The protection film may be formed of, for example, an inorganic substance such as silicon oxide, silicon nitride, or silicon oxynitride.

An insulating film 170 may be arranged on the substrate 100. The insulating film 170 may be a planarization film or a protection film. When the organic light-emitting device is arranged on the TFT, the insulating film 170 may also planarize an upper surface of the TFT and protect the TFT and other various components.

The insulating film 170 may be formed of, for example, an acryl-based organic substance or benzocyclobutene (BCB). As illustrated in FIG. 1, the buffer layer 110, the gate insulating film 130, the interlayer insulating film 150, and the insulating film 170 may be formed on an entire surface of the substrate 100.

The pixel defining layer 180 may be arranged on the TFT. The pixel defining layer 180 may be arranged on the insulating film 170 and may have an opening OP that exposes a center portion of the pixel electrode 210 and covering an edge of the pixel defining layer 180, which is described later. The pixel defining layer 180 may define to be a light-emitting region on the substrate 100.

The pixel defining layer 180 may be, for example, an organic insulating film. The organic insulating film may include an acryl-based polymer such as poly(methyl methacrylate) (PMMA), polystyrene (PS), a polymer derivative having a phenol group, an imide-based polymer, an aryl ether-based polymer, an amide-based polymer, a fluorine-based polymer, a p-xylene based polymer, a vinyl alcohol-based polymer, and a combination thereof.

The pixel electrode 210 may be arranged on the insulating film 170. The organic light-emitting device may include the pixel electrode 210, the intermediate layer 220 including an emission layer EML, which is described later, and an opposing electrode 230. The pixel electrode 210 may be electrically connected to the TFT and the organic light-emitting device may emit light according to an electric signal output from the TFT. The pixel electrode 210 may be electrically connected to any one of the source electrode 160 and the drain electrode 162 of the TFT through a via hole formed in the insulating film 170.

The center portion of the pixel electrode 210 may be exposed by the opening OP of the pixel defining layer 180. The center portion of the pixel electrode 210 that is exposed by the pixel defining layer 180 may be interested to be the light-emitting region. An edge portion of the pixel electrode 210 may be formed in a structure of being covered by the pixel defining layer 180.

The pixel electrode 210 may be formed as a (semi-) transparent electrode or a reflective electrode. When the pixel electrode 210 is formed as a (semi-) transparent electrode, the pixel electrode 210 may be formed of, for example, ITO, IZO, ZnO, In$_2$O$_3$, IGO, or AZO. When the pixel electrode 210 is formed in a reflective electrode, the pixel electrode 210 may have a reflective film formed of, for example, Ag, Mg, Al, Pt, Pd, Au, Ni, Nd, Ir, Cr, and a combination thereof, and a layer formed of ITO, IZO, ZnO, In$_2$O$_3$, IGO, or AZO. In an embodiment, the pixel electrode 210 may be formed of various materials. The structure of the pixel electrode 210 may be variously formed, for example, in a single layer or a multilayer.

The first low reflection layer 300 may be interposed between the pixel electrode 210 and the pixel defining layer 180. The first low reflection layer 300 may be on the edge portion of the pixel electrode 210 that is covered by the pixel defining layer 180. The first low reflection layer 300 may overlay the edge portion of the pixel electrode 210 and may have a shape that exposes the center portion of the pixel electrode 210, i.e., the first low reflection layer 300 may not be in the center portion of the pixel electrode 210.

The first low reflection layer 300 may have a first etching surface 300a and a second etching surface 300b. The first etching surface 300a may be arranged at the outer side of the second etching surface 300b and may signify a portion covered by the pixel defining layer 180. The second etching surface 300b may be arranged adjacent to the light-emitting region of the pixel electrode 210 and may signify a portion exposed by the pixel defining layer 180.

The first etching surface 300a may have the same etching surface as that of the pixel electrode 210. The pixel electrode 210 and the first low reflection layer 300 may be simultaneously patterned in a manufacturing process, which is described below in detail in the description of a manufacturing method. The second etching surface 300b may have the same etching surface as the etching surface that forms the opening OP of the pixel defining layer 180 exposing the center portion of the pixel electrode 21. The center portion of the first low reflection layer 300 corresponding to the center portion of the pixel electrode 210 may be etched using a pattern of the opening OP of the pixel defining layer 180 in the manufacturing process, which is described below in detail in the description of a manufacturing method.

The first low reflection layer 300 may include a metal material. Metal having a low reflectivity may be used as the metal material, and the reflectivity of the first low reflection layer 300 may be equal to or less than 60%. For example, the first low reflection layer 300 may be formed of TiN, Cr/CrO$_x$, TaO$_x$, MoO$_x$, black resin, or a polarization material. The polarization material may include a circular polarized film attached on an upper portion of a panel to reduce the reflectivity of a metal film visible to a viewer in the organic light-emitting display apparatus. The polarization material in conjunction with the reflection from the metal film, may result in offset interference, reducing visibility of the reflected light.

The second low reflection layer 320 may be arranged on the source electrode 160 and the drain electrode 162. The second low reflection layer 320 may be arranged to directly contact the source electrode 160 and the drain electrode 162. The insulating film 170 may be arranged on the TFT to cover the TFT. The second low reflection layer 320 may be interposed between the source electrode 160 and the drain electrode 162, and the insulating film 170.

The second low reflection layer 320 may have the same etching surface as those of the source electrode 160 and the drain electrode 162. Referring to FIG. 2, an etching surface 162a of the drain electrode 162 and an etching surface 320a of the second low reflection layer 320 formed on the drain electrode 162 may be identical to each other. Although only the etching surface 162a of the drain electrode 162 is presented as an example, as illustrated in FIG. 2, the etching surface of the source electrode 160 may also be the same as the etching surface 320a of the second low reflection layer 320. When the source electrode 160 and the drain electrode 162 are patterned, the second low reflection layer 320 may be etched, and may be simultaneously patterned in the manufacturing process, which is described below in detail in the description of a manufacturing method.

The second low reflection layer 320 may include a metal material. Metal having a low reflectivity may be used as the metal material, and the reflectivity of the second low reflection layer 320 may be equal to or less than 60%. For example, the second low reflection layer 320 may be formed of TiN, Cr/CrO$_x$, TaO$_x$, MoO$_x$, black resin, or a polarization material. The polarization material may include a circular polarized film attached on an upper portion of a panel to reduce the reflectivity of a metal film in the organic light-emitting display apparatus. The polarization material in conjunction with the reflection of the metal film may result in offset interference, reducing visibility of reflected light.

For the organic light-emitting display apparatus, light may be reflected from a pattern of the pixel electrode 210 other than the light-emitting region of the organic light-emitting device. To prevent reduction of reflection visibility according to the external light reflection characteristics of a panel, for example, due to the light, the first low reflection layer 300 may be arranged between the pixel electrode 210 and the pixel defining layer 180. The external light reflection characteristics may cause light to be reflected by the source electrode 160 and the drain electrode 162 arranged under the organic light-emitting device, and the external light reflection by the source electrode 160 and the drain electrode 162 may be prevented by arranging the second low reflection layer 320 on the source electrode 160 and the drain electrode 162. The first low reflection layer 300 and the second low reflection layer 320 may be formed to include a metal material having a low reflectivity as described above, light reflected from a region other than the light-emitting region may be reduced, and the reduction of reflection visibility according to the external light reflection characteristics of a panel may be remarkably reduced.

The intermediate layer 220 may be arranged in the light-emitting region that is defined by the pixel defining layer 180. For example, the intermediate layer 220 may include an emission layer (EML) emitting light according to an electric signal and may further include a hole injection layer (HIL) arranged between the EML and the pixel electrode 210, a hole transport layer (HTL), and an electron transport layer (ETL) arranged between the EML and the opposing electrode 230, and an electron injection layer (EIL), which are stacked in a single or combined structure. In an embodiment, the intermediate layer 220 may have various structures.

The opposing electrode 230 facing the pixel electrode 210 while covering the intermediate layer 220 including the EML may be arranged on the entire surface of the substrate 100. The opposing electrode 230 may be formed as a (semi-) transparent electrode or a reflective electrode.

When the opposing electrode 230 is formed as a (semi-) transparent electrode, the opposing electrode 230 may have a layer formed of a metal having a low work function, that is, Li, Ca, LiF/Ca, LiF/Al, Al, Ag, Mg, and a compound thereof, and a (semi-) transparent conductive layer such as ITO, IZO, ZnO, or In$_2$O$_3$. When the opposing electrode 230 is formed as a reflective electrode, the opposing electrode 230 may have a layer formed of Li, Ca, LiF/Ca, LiF/Al, Al, Ag, Mg, and a compound thereof. In an embodiment, the structure and material of the opposing electrode 230 may be variously modified.

In the above description only the organic light-emitting display apparatus is mainly described. In an embodiment, a method of manufacturing an organic light-emitting display apparatus using the organic light-emitting display apparatus may be provided.

Figure 3:
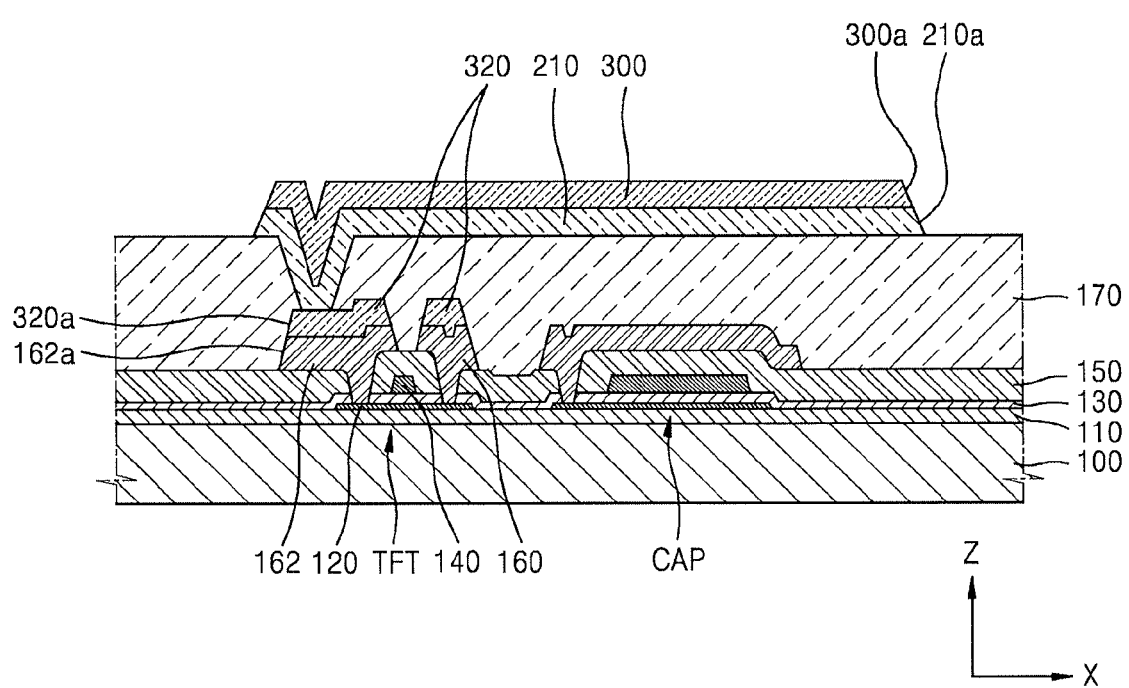
FIGS. 3 to 5 illustrate schematic cross-sectional views of stages in a manufacturing process of the organic light-emitting display apparatus of FIG. 1.
Figure 4:
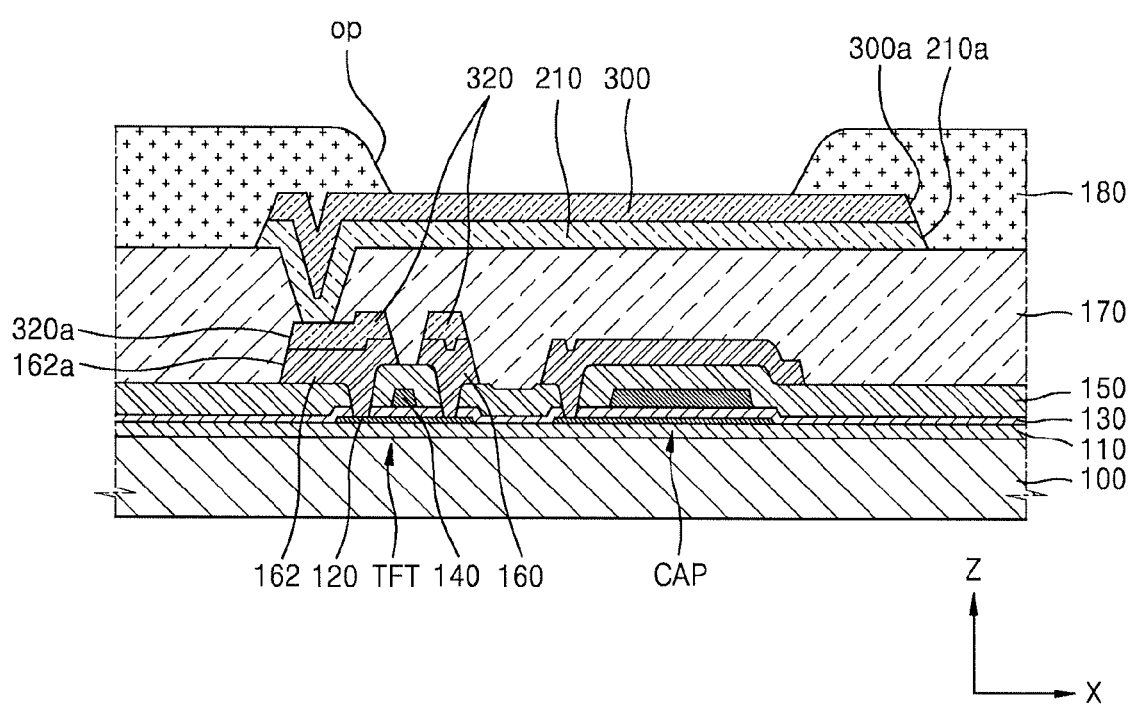
Figure 5:
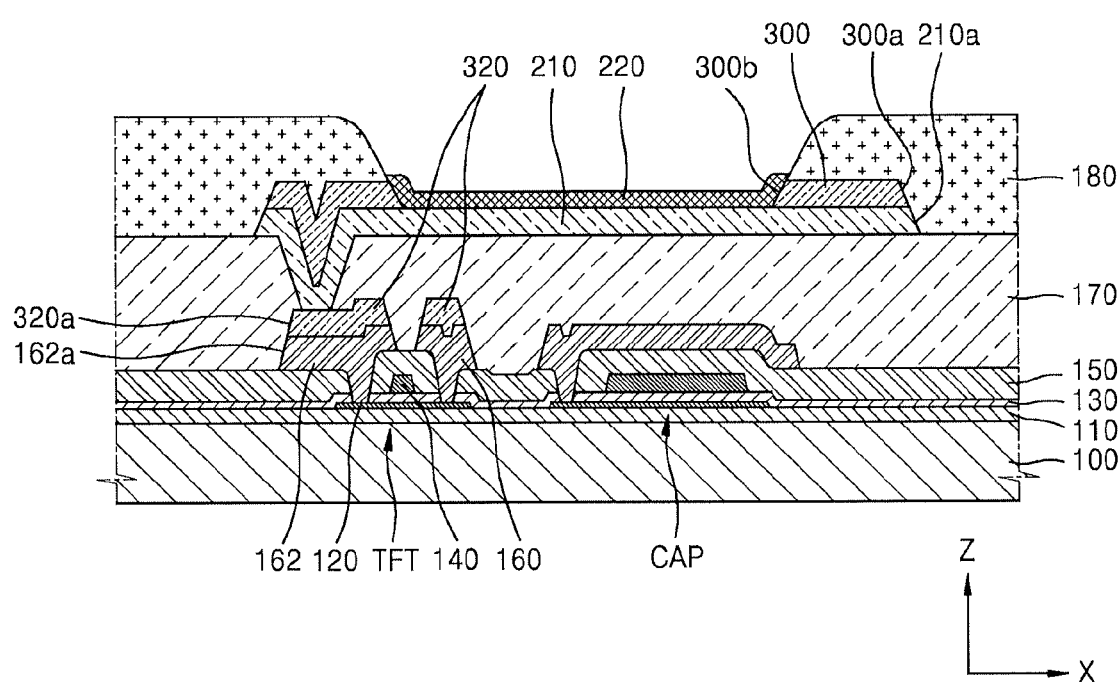

FIGS. 3 to 5 illustrate schematic cross-sectional views of manufacturing processes of the organic light-emitting display apparatus of FIG. 1.

Referring to FIG. 3, first, components including the TFT and the CAP may be formed on the substrate 100. Although FIG. 3 illustrates only one TFT and one CAP, in some case, a plurality of TFTs and CAPs may be provided. First, to planarize the surface of the substrate 100 or prevent intrusion of impurities into the semiconductor layer 120 of the TFT, the buffer layer 110 formed of silicon oxide or silicon nitride may be arranged on the substrate 100. Then, the semiconductor layer 120 may be arranged on the buffer layer 110.

Next, to secure insulation between the semiconductor layer 120 and the gate electrode 140, the gate insulating film 130 formed of silicon oxide and/or silicon nitride may be formed on the semiconductor layer 120.

After the gate insulating film 130 is formed, the gate electrode 140 may be formed on the semiconductor layer 120. The source electrode 160 and the drain electrode 162 may be electrically connected to each other according to a signal applied to the gate electrode 140.

While the interlayer insulating film 150 may be arranged on the gate electrode 140, the interlayer insulating film 150 may be formed of a material such as silicon oxide or silicon nitride in a single layer or a multilayer.

The source electrode 160 and the drain electrode 162 may be formed on the interlayer insulating film 150. The source electrode 160 and the drain electrode 162 may be electrically connected to the semiconductor layer 120 via contact holes formed in the interlayer insulating film 150 and the gate insulating film 130.

In consideration of conductivity, the gate electrode 140, the source electrode 160, and the drain electrode 162, which are described above, may be formed of at least one material of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in a single layer or a multilayer.

A protection film covering the TFT may be arranged to protect the TFT having the above structure. The protection film may be formed of, for example, an inorganic substance such as silicon oxide, silicon nitride, or silicon oxynitride.

The insulating film 170 may be formed on the substrate 100. The insulating film 170 may be a planarized film or a protection film. When the organic light-emitting device is arranged on the TFT, the insulating film 170 may also planarize the upper surface of the TFT and protect the TFT and other various components. The insulating film 170 may be formed of, for example, an acryl-based organic substance or benzocyclobutene (BCB). Then, a via hole that exposes any one of the source electrode 160 and the drain electrode 162 of the TFT may be formed in the insulating film 170. The pixel electrode 210 may be electrically connected to the TFT through the via hole.

The buffer layer 110, the gate insulating film 130, the interlayer insulating film 150, and the insulating film 170 may be formed on the entire surface of the substrate 100.

Then, a conductive layer may be coated on the insulating film 170 to be electrically connected to the TFT through the via hole. The conductive layer is patterned to be the pixel electrode 210, and the pixel electrode 210 may be formed as a (semi-) transparent electrode or a reflective electrode. When the pixel electrode 210 is formed as a (semi-) transparent electrode, the pixel electrode 210 may be formed of for example, ITO, IZO, ZnO, In2O3, IGO, or AZO. When the pixel electrode 210 is formed as a reflective electrode, the pixel electrode 210 may have a reflective film formed of, for example, Ag, Mg, Al, Pt, Pd, Au, Ni, Nd, Ir, Cr, and a combination thereof, and a layer formed of ITO, IZO, ZnO, $In_2O_3$, IGO, or AZO.

The first low reflection layer 300 including a metal material may be formed on the conductive layer. Metal having a low reflectivity may be used as the metal material, and the reflectivity of the first low reflection layer 300 may be equal to or less than 60%. For example, the first low reflection layer 300 may be formed of TiN, $Cr/CrO_x$, $TaO_x$, $MoO_x$, black resin, or a polarization material. The polarization material may include a circular polarized film attached on an upper portion of a panel to reduce the reflectivity of a metal film in the organic light-emitting display apparatus. The polarization material in conjunction with the reflection of the metal film may result in offset interference, reducing visibility of reflected light.

Then, the conductive layer and the first low reflection layer 300 both may be simultaneously etched to be patterned. A patterned conductive layer may become the pixel electrode 210, and the first low reflection layer 300 may be formed to have the same pattern as that of the pixel electrode 210.

Next, referring to FIG. 4, to define the light-emitting region of the pixel electrode 210, the pixel defining layer 180 may be formed on the insulating film 170. The pixel defining layer 180 may have an opening OP that exposes a center portion of the pixel electrode 210 and covering an edge of the first low reflection layer 300. The center portion of the first low reflection layer 300 may be exposed through the opening OP of the pixel defining layer 180. The opening OP of the pixel defining layer 180 may be used as a pattern layer (masking layer) in the subsequent process.

Referring to FIG. 5, the pixel electrode 210 formed under the first low reflection layer 300 may be exposed by etching the center portion of the first low reflection layer 300 that is exposed through the opening OP of the pixel defining layer 180, and after the center portion of the first low reflection layer 300 is etched, the center portion of the pixel electrode 210 may be etched.

The first etching surface 300a and the second etching surface 300b may be obtained by patterning the first low reflection layer 300 twice. The first etching surface 300a that is patterned simultaneously with the pixel electrode 210 may be covered by the pixel defining layer 180. The second etching surface 300b is a surface formed by being etched through the opening OP of the pixel defining layer 180 and may be exposed by the pixel defining layer 180. Forming the first etching surface 300a may be performed simultaneously with forming the pixel electrode 210, and forming the second etching surface 300b may be simultaneously performed with etching the first low reflection layer 300.

Referring to FIGS. 3 to 5, in some case, in forming the source electrode 160 and the drain electrode 162 of the TFT, the second low reflection layer 320 may be further formed on the source electrode 160 and the drain electrode 162.

Forming the source electrode 160 and the drain electrode 162 may include forming a conductive layer to be electrically connected to the semiconductor layer of the TFT and forming the second low reflection layer 320 including a metal material on the conductive layer. The conductive layer may be formed of at least one material of, for example, aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

Then, the conductive layer and the second low reflection layer 320 may be simultaneously patterned. A patterned conductive layer may become the source electrode 160 and the drain electrode 162, and the etching surface 162a of the source electrode 160 and the drain electrode 162, and the etching surface 320a of the second low reflection layer 320, may be formed to be the same surface.

Referring back to FIG. 5, the intermediate layer 220 including the light-emitting layer may be formed on the pixel electrode 210. Forming the opposing electrode 230 may be performed thereafter.

For the organic light-emitting display apparatus, light may be reflected from a pattern of the pixel electrode 210 other than the light-emitting region of the organic light-emitting device. To prevent reduction of reflection visibility according to the external light reflection characteristics of a panel, for example, due to the light, the first low reflection layer 300 may be arranged between the pixel electrode 210 and the pixel defining layer 180. The external light reflection characteristics may cause light to be reflected by the source electrode 160 and the drain electrode 162 arranged under the organic light-emitting device, and the external light reflection by the source electrode 160 and the drain electrode 162 may be prevented by arranging the second low reflection layer 320 on the source electrode 160 and the drain electrode 162. The first low reflection layer 300 and the second low reflection layer 320 may be formed to include a metal material having a low reflectivity as described above, light reflected from a region other than the light-emitting region may be reduced, and the reduction of reflection visibility according to the external light reflection characteristics of a panel may be remarkably reduced.

By way of summation and review, as described above, embodiments may provide an organic light-emitting display apparatus in which external light reflection characteristics of a panel may be reduced, and a manufacturing method thereof. In particular, by shielding reflective portions in the apparatus that are outside the display area, e.g., by forming such shields simultaneously with the reflection portions, visibility of the reflective portions may be reduced.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display apparatus, comprising:
   a substrate;
   a thin film transistor on the substrate;
   a pixel electrode electrically connected to the thin film transistor;
   a pixel defining layer having an opening exposing a center portion of the pixel electrode and covering an edge of the pixel electrode; and
   a first low reflection layer between the pixel electrode and the pixel defining layer, the first low reflection layer including a metal, wherein
   reflectivity of the first low reflection layer is equal to or less than 60%.

2. The apparatus as claimed in claim 1, wherein the first low reflection layer is on the edge of the pixel electrode covered by the pixel defining layer.

3. The apparatus as claimed in claim 1, wherein the first low reflection layer is on the pixel electrode except an opening of the pixel defining layer.

4. The apparatus as claimed in claim 3, wherein the first low reflection layer includes a first etching surface covered by the pixel defining layer and a second etching surface exposed by the pixel defining layer.

5. The apparatus as claimed in claim 4, wherein the first etching surface has a same etching surface as the pixel electrode.

6. The apparatus as claimed in claim 4, wherein the second etching surface has a same etching surface as the pixel defining layer that exposes the center portion of the pixel electrode.

7. The apparatus as claimed in claim 1, wherein the thin film transistor includes a semiconductor layer, a gate electrode, a source electrode, and a drain electrode, and the apparatus further comprises a second low reflection layer that is on the source electrode and the drain electrode and includes a metal.

8. The apparatus as claimed in claim 7, further comprising an insulating film between the thin film transistor and the pixel electrode, the pixel electrode on the insulating film, wherein, the insulating film is between the pixel electrode and the source electrode and the drain electrode,
   wherein the second low reflection layer is between the insulating film and the source electrode and the drain electrode.

9. The apparatus as claimed in claim 7, wherein the second low reflection layer directly contacts the source electrode and the drain electrode.

10. The apparatus as claimed in claim 7, wherein the second low reflection layer, the source electrode, and the drain electrode have a same etching surface.

11. An organic light-emitting display apparatus, comprising:
    a substrate;
    a thin film transistor on the substrate;
    a pixel electrode electrically connected to the thin film transistor;
    a pixel defining layer having an opening exposing a center portion of the pixel electrode and covering an edge of the pixel electrode; and
    a first low reflection layer between the pixel electrode and the pixel defining layer, the first low reflection layer including a metal, wherein the first low reflection layer includes one of TiN, $Cr/CrO_x$, $TaO_x$, $MoO_x$, black resin, or a polarization material.

12. A method of manufacturing an organic light-emitting display apparatus, the method comprising:
- forming a thin film transistor on a substrate;
- forming a pixel electrode and a first low reflection layer by coating a conductive layer on the substrate to be electrically connected to the thin film transistor, coating a first low reflection layer including a metal material on the conductive layer, and simultaneously patterning the conductive layer and the first low reflection layer;
- forming a pixel defining layer having an opening that exposes a center portion of the first low reflection layer and covers an edge of the first low reflection layer; and
- etching the center portion of the first low reflection layer that is exposed by the opening of the pixel defining layer, wherein
- reflectivity of the first low reflection layer is equal to or less than 60%.

13. The method as claimed in claim 12, wherein, in etching the center portion of the first low reflection layer, the pixel electrode is exposed through the opening of the pixel defining layer as the first low reflection layer is etched.

14. The method as claimed in claim 12, wherein the first low reflection layer is formed to have a first etching surface covered by the pixel defining layer and a second etching surface exposed by the pixel defining layer, and
- forming the first low reflection layer is performed simultaneously with forming the pixel electrode and forming the second etching surface is performed simultaneously with etching the center portion of the first low reflection layer.

15. The method as claimed in claim 12, wherein forming the thin film transistor includes:
- forming a semiconductor layer;
- forming a gate electrode; and
- forming a source electrode and a drain electrode on which a second low reflection layer is formed.

16. The method as claimed in claim 15, wherein forming the source electrode and the drain electrode includes:
- forming a conductive layer to be electrically connected to the semiconductor layer;
- forming the second low reflection layer including a metal material on the conductive layer; and
- simultaneously patterning the conductive layer and the second low reflection layer.

17. The method as claimed in claim 16, wherein the source electrode, the drain electrode, and the second low reflection layer have a same etching surface.

18. A method of manufacturing an organic light-emitting display apparatus, the method comprising:
- forming a thin film transistor on a substrate;
- forming an insulating film on the thin film transistor to cover the thin film transistor;
- forming a pixel electrode and a first low reflection layer by coating a conductive layer on the insulating film to be electrically connected to the thin film transistor, coating a first low reflection layer including a metal material on the conductive layer, and simultaneously patterning the conductive layer and the first low reflection layer;
- forming a pixel defining layer having an opening that exposes a center portion of the first low reflection layer and covers an edge of the first low reflection layer; and
- etching the center portion of the first low reflection layer that is exposed by the opening of the pixel defining layer, wherein the first low reflection layer and the second low reflection layer each includes one of TiN, $Cr/CrO_x$, $TaO_x$, $MoO_x$, black resin, or a polarization material.

* * * * *